(12) United States Patent
Fukuzumi et al.

(10) Patent No.: US 8,476,708 B2
(45) Date of Patent: Jul. 2, 2013

(54) SEMICONDUCTOR MEMORY DEVICE HAVING A CIRCUIT FORMED ON A SINGLE CRYSTAL SEMICONDUCTOR LAYER WITH VARIED GERMANIUM CONCENTRATION

(75) Inventors: Yoshiaki Fukuzumi, Yokohama (JP); Hideaki Aochi, Kawasaki (JP); Masaru Kito, Kuwana (JP); Kiyotaka Miyano, Tokyo (JP); Shinji Mori, Yokohama (JP); Ichiro Mizushima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/346,888

(22) Filed: Jan. 10, 2012

(65) Prior Publication Data

US 2012/0181602 A1 Jul. 19, 2012

(30) Foreign Application Priority Data

Jan. 13, 2011 (JP) ................................. 2011-004954

(51) Int. Cl.
| | |
|---|---|
| H01L 27/01 | (2006.01) |
| H01L 27/12 | (2006.01) |
| H01L 31/0392 | (2006.01) |
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |
| H01L 29/792 | (2006.01) |

(52) U.S. Cl.
USPC ........... 257/350; 257/326; 257/347; 257/351; 257/390; 257/391; 257/E27.011; 257/E27.026; 257/E27.027; 257/E29.17; 257/E29.286; 257/E29.308

(58) Field of Classification Search
USPC .......... 257/326, 347, 350, 390, 391, E27.011, 257/E27.076, E29.17, E29.286, E29.308, 257/351, E27.026, E27.027
See application file for complete search history.

(56) References Cited

U.S. PATENT DOCUMENTS

| | | | | |
|---|---|---|---|---|
| 5,675,185 A | * | 10/1997 | Chen et al. ..................... | 257/774 |
| 5,889,302 A | * | 3/1999 | Liu ................................ | 257/315 |
| 6,140,672 A | * | 10/2000 | Arita et al. .................... | 257/295 |
| 6,436,827 B1 | * | 8/2002 | Yamazaki et al. ............. | 438/688 |
| 6,600,173 B2 | * | 7/2003 | Tiwari ............................ | 257/74 |
| 6,882,010 B2 | * | 4/2005 | Bhattacharyya ............... | 257/350 |
| 7,214,963 B2 | * | 5/2007 | Choi et al. ..................... | 257/67 |

(Continued)

FOREIGN PATENT DOCUMENTS

JP 2010-34109 2/2010

OTHER PUBLICATIONS

U.S. Appl. No. 13/227,882, filed Sep. 8, 2011, Ichiro Mizushima, et al.

*Primary Examiner* — Ida M Soward
(74) *Attorney, Agent, or Firm* — Oblon, Spivak, McClelland, Maier & Neustadt, L.L.P.

(57) ABSTRACT

According to one embodiment, a semiconductor memory device includes a semiconductor substrate, memory cell array portion, single-crystal semiconductor layer, and circuit portion. The memory cell array portion is formed on the semiconductor substrate, and includes memory cells. The semiconductor layer is formed on the memory cell array portion, and connected to the semiconductor substrate by being formed in a hole extending through the memory cell array portion.

The circuit portion is formed on the semiconductor layer. The Ge concentration in the lower portion of the semiconductor layer is higher than that in the upper portion of the semiconductor layer.

15 Claims, 9 Drawing Sheets

U.S. PATENT DOCUMENTS

| | | | |
|---|---|---|---|
| 7,250,628 B2* | 7/2007 | Bhattacharyya | 257/66 |
| 7,485,508 B2* | 2/2009 | Dyer et al. | 438/154 |
| 7,626,228 B2* | 12/2009 | Park et al. | 257/326 |
| 7,670,927 B2* | 3/2010 | Bernstein et al. | 438/455 |
| 7,741,644 B2* | 6/2010 | Lyu et al. | 257/67 |
| 7,799,675 B2* | 9/2010 | Lee | 438/637 |
| 7,863,746 B2* | 1/2011 | Yi et al. | 257/758 |
| 7,910,433 B2* | 3/2011 | Jang et al. | 438/257 |
| 7,915,645 B2* | 3/2011 | Briere | 257/195 |
| 7,982,221 B2* | 7/2011 | Han et al. | 257/67 |
| 8,044,448 B2 | 10/2011 | Kamigaichi et al. | |
| 8,232,598 B2* | 7/2012 | Yamazaki et al. | 257/351 |
| 8,237,228 B2* | 8/2012 | Or-Bach et al. | 257/369 |
| 8,241,989 B2* | 8/2012 | Hofmann | 438/421 |
| 8,288,856 B2* | 10/2012 | Yamaguchi et al. | 257/686 |
| 8,299,583 B2* | 10/2012 | Zhu | 257/621 |
| 8,324,070 B2* | 12/2012 | Hwang | 438/405 |
| 2005/0280156 A1* | 12/2005 | Lee | 257/758 |
| 2007/0158731 A1* | 7/2007 | Bae et al. | 257/314 |
| 2008/0031048 A1* | 2/2008 | Jeong et al. | 365/185.17 |
| 2008/0191247 A1* | 8/2008 | Yin et al. | 257/204 |
| 2009/0267233 A1* | 10/2009 | Lee | 257/758 |
| 2009/0297091 A1* | 12/2009 | Assefa et al. | 385/14 |
| 2010/0012980 A1* | 1/2010 | Song et al. | 257/208 |
| 2011/0014781 A1 | 1/2011 | Itokawa et al. | |
| 2011/0143506 A1* | 6/2011 | Lee | 438/238 |
| 2011/0193166 A1* | 8/2011 | Liang et al. | 257/348 |
| 2011/0233646 A1 | 9/2011 | Mizushima et al. | |

* cited by examiner

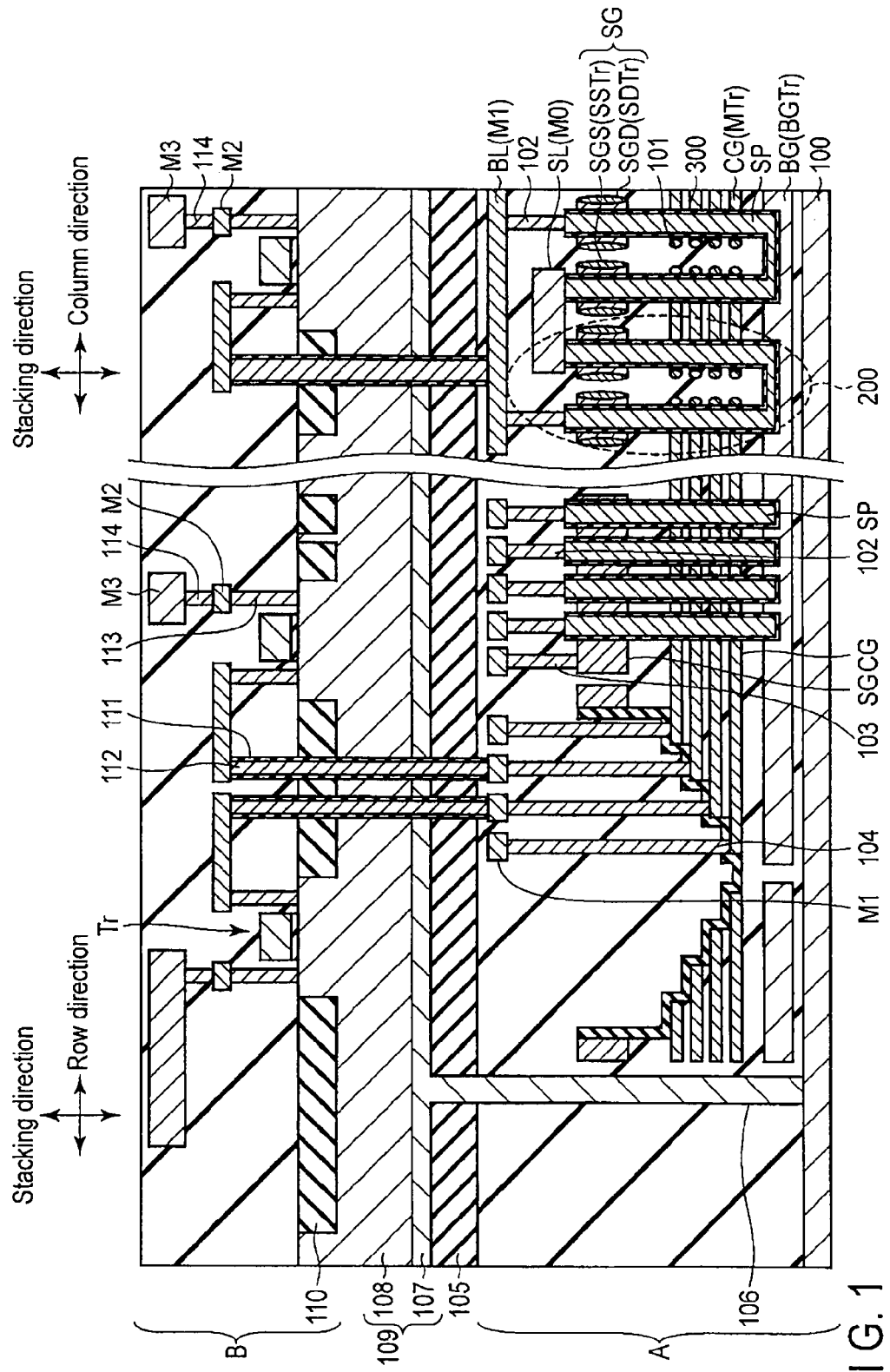
F I G. 1

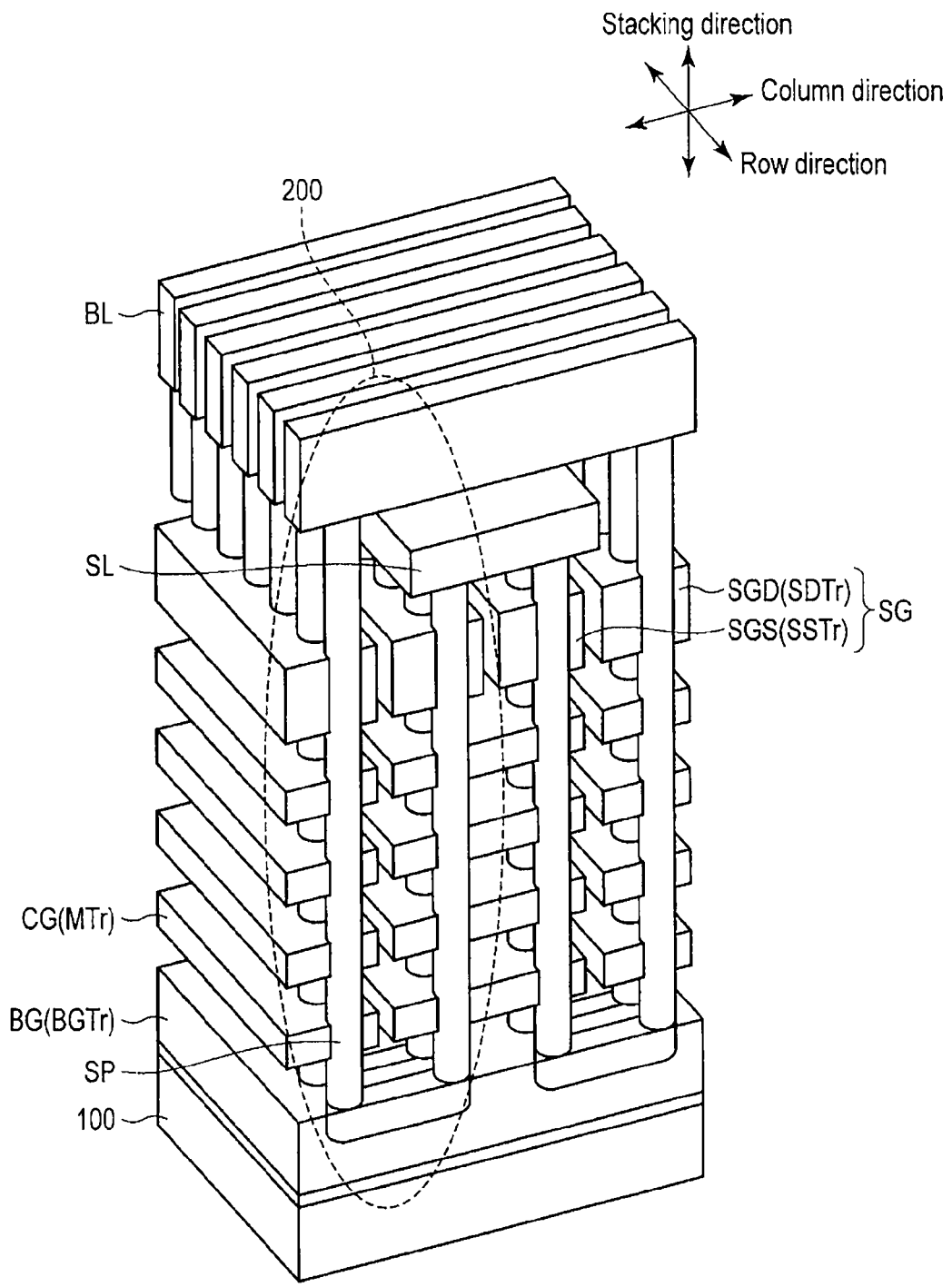
F I G. 2

SEMICONDUCTOR MEMORY DEVICE HAVING A CIRCUIT FORMED ON A SINGLE CRYSTAL SEMICONDUCTOR LAYER WITH VARIED GERMANIUM CONCENTRATION

CROSS-REFERENCE TO RELATED APPLICATIONS

This application is based upon and claims the benefit of priority from prior Japanese Patent Application No. 2011-004954, filed Jan. 13, 2011, the entire contents of which are incorporated herein by reference.

FIELD

Embodiments described herein relate generally to a semiconductor memory device and a method of manufacturing the same.

BACKGROUND

As a technique of increasing the density of a memory without depending on lithography, structures such as a structure in which a one-time-programmable (OTP) element is sandwiched between multiple interconnection layers and a structure in which a plurality of NAND flash memory layers are formed by repeating epitaxial growth of silicon films have been proposed. However, these structures have the problem that the number of times of lithography increases as the number of stacked layers increases. Therefore, a collectively processed, three-dimensionally stacked memory has been proposed as a technique replacing these structures.

In this three-dimensionally stacked memory, a hole (memory hole) is formed at once through a plurality of electrodes stacked on a semiconductor substrate, and a memory film is formed on the inner walls of the hole. After that, the hole is filled with a polysilicon film (silicon pillar). Consequently, a memory string including a plurality of memory elements connected in series in the stacking direction can be formed at one time. This makes it possible to implement a memory for which the number of lithography steps hardly increases even when the number of layers to be stacked is increased.

In the three-dimensionally stacked memory as described above, the insulating film (memory film) of the memory element is formed on the inner walls of the hole before the formation of a polysilicon film serving as a channel. After that, only the insulating film formed on the bottom of the hole must be removed in order to supply an electric current to the memory string by improving the connection between the polysilicon film and, for example, a source line (for example, polysilicon) positioned below the polysilicon film. This imposes the technical limitation that it is necessary to use a memory film configuration that can withstand processing with diluted hydrofluoric acid to remove the insulating film from the bottom. When using, for example, the multilevel-cell technology as a method of further increasing the density of the three-dimensionally stacked memory, this limitation increases the difficulty in development of the memory film configuration, so the situation is not necessarily favorable.

To improve this situation, a three-dimensionally stacked memory using a U-shaped silicon pillar as a memory string has been proposed. This U-shaped silicon pillar includes a pair of columnar portions and a connecting portion for connecting the lower ends of these columnar portions. The upper portion of one of the pair of columnar portions is connected to a bit line, and the upper portion of the other columnar portion is connected to a source line. That is, there is no polysilicon-polysilicon contact on the bottom of a memory hole, and this obviates the removal of an insulating film from the bottom. This can increase the degree of freedom of the memory film configuration.

On the other hand, to reduce the chip occupation ratio of the three-dimensionally stacked memory cell array as described above and a control circuit for controlling the array, a technique of forming the control circuit on a semiconductor substrate immediately below the memory cell array has been proposed. If the control circuit is formed below the memory cell array, however, the control circuit, for example, a sense amplifier and a bit line interconnection must be connected by a contact plug formed in a memory cell array end portion. That is, the bit line interconnection is connected to a bit line extension formed below the memory cell array via the contact plug formed in the memory cell array end portion, and the bit line extension is connected to, for example, a transistor (sense amplifier) formed on the semiconductor substrate.

This structure poses the problems that, for example, a fine interconnection layer (the bit line extension) equivalent to a bit line is necessary below the memory cell array, a region having a considerable size is necessary in the memory cell array periphery in order to form a deep contact, and the bit line practically gets longer to increase the bit line capacitance, thereby affecting the operating speed.

BRIEF DESCRIPTION OF THE DRAWINGS

FIG. 1 is a sectional view showing a semiconductor memory device according to the first embodiment along the row and column directions;

FIG. 2 is a perspective view of a memory cell string shown in FIG. 1;

DETAILED DESCRIPTION

In general, according to one embodiment, a semiconductor memory device includes a semiconductor substrate, memory cell array portion, single-crystal semiconductor layer, and circuit portion. The memory cell array portion is formed on the semiconductor substrate, and includes a plurality of memory cells for storing data. The single-crystal semiconductor layer is formed on an insulating layer on the memory cell array portion, and connected to the semiconductor substrate by being formed in a hole extending through the insulating layer and memory cell array portion. The circuit portion is formed on the single-crystal semiconductor layer. The Ge concentration in the lower portion of the single-crystal semiconductor layer on the memory cell array portion is higher than that in the upper portion of the single-crystal semiconductor layer.

<First Embodiment>

A semiconductor memory device according to the first embodiment will be explained below with reference to FIGS. 1, 2, 3, 4, 5, 6, and 7. The first embodiment is an example in which a single-crystal semiconductor layer in which a control circuit is to be formed is formed immediately above a memory cell array.

[Structure]

Figure 3:
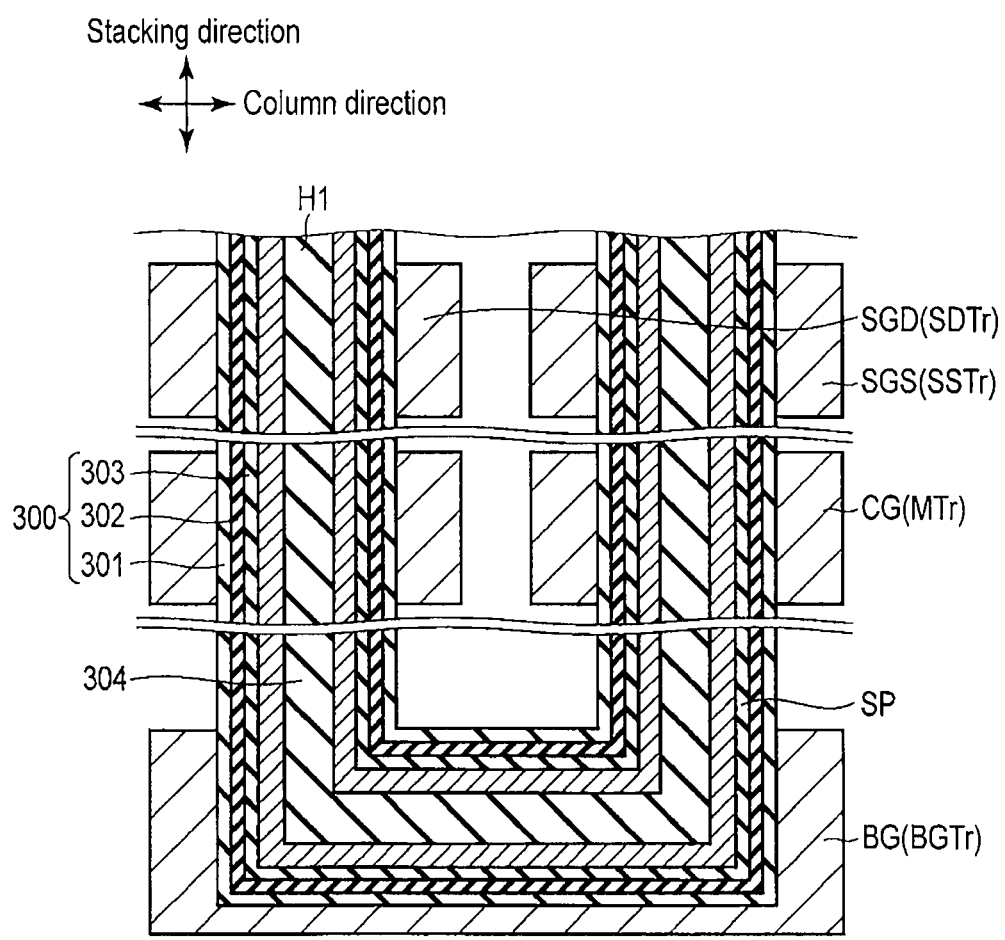
FIG. 3 is an enlarged sectional view of the memory cell string shown in FIG. 2.

The structure of the semiconductor memory device according to the first embodiment will be explained below with reference to FIGS. 1, 2, and 3.

FIG. 1 is a sectional view taken along the row and column directions of the semiconductor memory device according to the first embodiment. FIG. 2 is a perspective view of a memory cell string shown in FIG. 1. FIG. 3 is an enlarged sectional view of the memory cell string.

As shown in FIG. 1, the semiconductor memory device according to this embodiment includes a memory cell array portion A and circuit portion B. Note that the memory cell array portion A indicates a layer in which a memory cell array is formed, and the circuit portion B indicates a layer in which circuits (for example, a control circuit) are formed.

In the memory cell array portion A as shown in FIG. 2, a plurality of memory cell strings 200 each including a U-shaped silicon pillar SP are formed above a semiconductor substrate (Si substrate) 100. The plurality of memory cell strings 200 are arranged in a matrix in the row and column directions.

Each memory cell string 200 includes a plurality of memory cell transistors MTr, and two selection transistors (a drain-side selection transistor SDTr and source-side selection transistor SSTr) formed on the two ends of the plurality of memory cell transistors MTr.

The plurality of memory cell transistors MTr are formed at the intersections of the U-shaped silicon pillar SP and a plurality of control gates CG (word lines), and have current paths connected in series in a stacking direction (a direction perpendicular to the semiconductor substrate 100). As shown in FIG. 3, each memory cell transistor MTr includes a memory film 300 between the U-shaped silicon pillar SP and control gate CG. The memory film 300 includes a tunnel insulating film 303, charge storage layer 302, and block insulating film 301 formed in this order around the U-shaped silicon pillar SP.

The drain-side selection transistor SDTr is formed at the intersection of the U-shaped silicon pillar SP and a drain-side selection gate SGD. The source-side selection transistor SSTr is formed at the intersection of the U-shaped silicon pillar SP and a source-side selection gate SGS. As shown in FIG. 3, the drain-side selection transistor SDTr and source-side selection transistor SSTr each have the same structure as that of the memory cell transistor MTr.

Also, to decrease the resistances of the control gates CG and selection gates SG (drain-side selection gate SGD and source-side selection gate SGS), a silicide layer 101 is formed on the end face of each gate in the column direction.

The U-shaped silicon pillar SP is formed into a U-shape in a section in the column direction. The U-shaped silicon pillar SP includes a pair of columnar portions extending in the stacking direction, and a connecting portion formed to connect the lower ends of the pair of columnar portions. The connecting portion is formed in a back gate BG, and forms a back gate transistor BGTr. Also, the U-shaped silicon pillar SP is formed such that a straight line connecting the central axes of the pair of columnar portions is parallel to the column direction. Furthermore, the U-shaped silicon pillars SP are arranged in a matrix in a plane taken along the row and column directions. In addition, as shown in FIG. 3, the U-shaped silicon pillar SP has a hollow H1, and the hollow H1 is filled with an insulator 304.

The plurality of control gates CG are stacked above the back gate BG, and arranged to perpendicularly intersect the columnar portions of the U-shaped silicon pillars SP. Each control gate CG extends along the row direction. Also, each control gate CG is shared by two adjacent columnar portions (two central columnar portions) of four columnar portions of two memory cell strings 200 adjacent to each other in the column direction. Furthermore, the plurality of control gates CG have a staircase shape in the end portion in the row direction. In other words, the end portion of each control gate CG projects when viewed from the upper surface. That is, an interconnection layer M1 is connected to the projecting upper surface of each control gate CG via a contact plug 104.

The back gate BG is formed below the lowermost control gates CG. The back gate BG two-dimensionally extends in the row and column directions so as to cover the connecting portions of the U-shaped silicon pillars SP.

The drain-side selection gate SGD and source-side selection gate SGS are formed above the uppermost control gates CG. The drain-side selection gate SGD and source-side selection gate SGS extend in the row direction. The drain-side selection gate SGD and source-side selection gate SGS are formed to intersect the columnar portions of the U-shaped silicon pillar SP, and formed by line-and-space as they are insulated and isolated from each other in the column direction. The upper surface of the end portion of the selection gate SG in the row direction is connected to interconnection layer M1 via a contact plug 103.

Source lines SL are formed above the source-side selection gates SGS. Each source line SL is shared by two adjacent columnar portions of four columnar portions of two memory cell strings 200 adjacent to each other in the column direction. The source lines SL extend in the row direction, and are formed by line-and-space as they are insulated and isolated from each other in the column direction.

A plurality of bit lines BL are formed above the source line SL. The bit lines BL extend in the column direction, and are formed by line-and-space as they are insulated and isolated from each other in the row direction.

In this embodiment, the circuit portion B is formed above the memory cell array portion A. The circuit portion B includes control circuit transistors Tr formed on a single-crystal semiconductor layer 109.

The single-crystal semiconductor layer 109 is formed on an isolation insulating layer 105 formed on the memory cell array portion A. The isolation insulating layer 105 is, for example, a TEOS film, and has a film thickness of about 500 nm. Also, shallow trench isolation (STI) 110 for element isolation consisting of, for example, a silicon oxide film is formed in the single-crystal semiconductor layer 109. Details of the single-crystal semiconductor layer 109 will be described later.

The control circuit transistors Tr are formed outside the STI 110 regions on the single-crystal semiconductor layer 109, and form, for example, driving circuits for applying voltages to individual electrodes in the memory cell array portion A, and a control circuit for controlling these circuits. One of the source and drain of the control circuit transistor Tr is connected to the bit line BL (interconnection layer M1) via an interconnection layer M2 and contact plug 112, and the other is connected to an interconnection layer M3 via a contact plug 113, interconnection layer M2, and a contact plug 114. Also, one of the source and drain of another control circuit transistor Tr is connected to interconnection layer M1 connected to the control gate CG, via interconnection layer M2 and contact plug 112, and the other is connected interconnection layer M3 via contact plug 113, interconnection layer M2, and contact plug 114.

Contact plugs 112 are formed in contact holes reaching interconnection layers M1 through the single-crystal semiconductor layer 109 and isolation insulating layer 105. That is, contact plugs 112 are formed immediately above interconnection layers M1, and connect the memory cell array portion A and the circuit portion B positioned immediately above the memory cell array portion A. Furthermore, to prevent a short-circuit in the single-crystal semiconductor layer 109, a sidewall insulating film 111 consisting of a silicon nitride film or the like is formed on the side surfaces of the contact holes.

The single-crystal semiconductor layer 109 of this embodiment includes a first semiconductor layer 107 and second semiconductor layer 108, and has a film thickness of about 2 µm.

The first semiconductor layer 107 is, for example, a single-crystal silicon germanium (SiGe) layer formed on the isolating insulating layer 105. The composition ratio of the single-crystal SiGe layer 107 is $Si_{1-X}Ge_X$ ($X \geq 0.5$, preferably, $X \geq 0.75$). That is, the germanium concentration in the single-crystal SiGe layer 107 is 50 atm % or more. The single-crystal SiGe layer 107 is also formed in a crystal connecting hole 106 extending through the isolation insulating layer 105 and memory cell array portion A and reaching the Si substrate 100, and is connected to the Si substrate 100. Thus, the first semiconductor layer 107 is connected to the Si substrate 100 as a single crystal via the crystal connecting hole 106, and hence is formed into a single crystal by succeeding the crystal orientation of the Si substrate 100.

The second semiconductor layer 108 is, for example, a single-crystal silicon (Si) layer formed on the first semiconductor layer 107. The single-crystal Si layer 108 is grown by using the single-crystal first semiconductor layer 107 as a crystal nucleus, and hence is formed into a single crystal by succeeding the crystal orientation of the Si substrate 100 and that of the first semiconductor layer 107. The Ge concentration in the second semiconductor layer 108 is set lower than that of the first semiconductor layer 107. That is, in the single-crystal semiconductor layer 109, the Ge concentration in the upper portion is lower than that in the lower portion. Note that the second semiconductor layer 108 is not limited to an Si layer and may also be an SiC or SiGe layer, but it is desirably an Si or SiC layer in order to improve the breakdown voltage characteristic. That is, in the single-crystal semiconductor layer 109, the Si concentration in the upper portion is desirably higher than that in the lower portion, and the C concentration in the upper portion is desirably higher than that in the lower portion. This makes it possible to improve the crystallinity and breakdown voltage characteristic of the control circuit element formation surface.

Note that the two-layered structure including the first semiconductor layer 107 and second semiconductor layer 108 has been explained as an example of the single-crystal semiconductor layer 109, but the present embodiment is not limited to this. That is, the single-crystal semiconductor layer 109 can also be formed as a gradation layer in which the Ge concentration gradually (moderately) decreases from the lower portion toward the upper portion, without any interface between the first semiconductor layer 107 and the second semiconductor layer 108 in the single-crystal semiconductor layer 109. This can reduce stress resulting from the difference between the crystal lattice constants.

Note also that the crystal connecting hole 106 is desirably formed to extend through the memory cell array portion A having a film thickness of, for example, 1 µm or more, and desirably formed for every few mm in the row and column directions. Since this increases the contact area between the crystal connecting holes 106 and the Si substrate 100, the single-crystal characteristic of the single-crystal semiconductor layer 109 can be improved.

Furthermore, the crystal connecting hole 106 is not limited to a column or square pillar, and can also be formed as a slit extending along the row or column direction. In addition, although the crystal connecting hole 106 is formed in the end portion of the memory cell array portion A in the row direction in FIG. 1, it may also be formed in the central portion of the memory cell array A so as not to be connected to each electrode and the like.

[Manufacturing Method]

A method of manufacturing the semiconductor memory device according to the first embodiment will be explained below with reference to FIGS. 4, 5, 6, and 7.

FIGS. 4, 5, 6, and 7 are sectional views of manufacturing steps taken along the row and column directions of the semiconductor memory device according to the first embodiment. Note that in this embodiment, various well known methods are applicable as a method of manufacturing the memory cell array portion A in the three-dimensionally stacked memory. In this embodiment, therefore, a method of manufacturing the circuit portion B positioned above the memory cell array portion A will mainly be explained.

Figure 4:
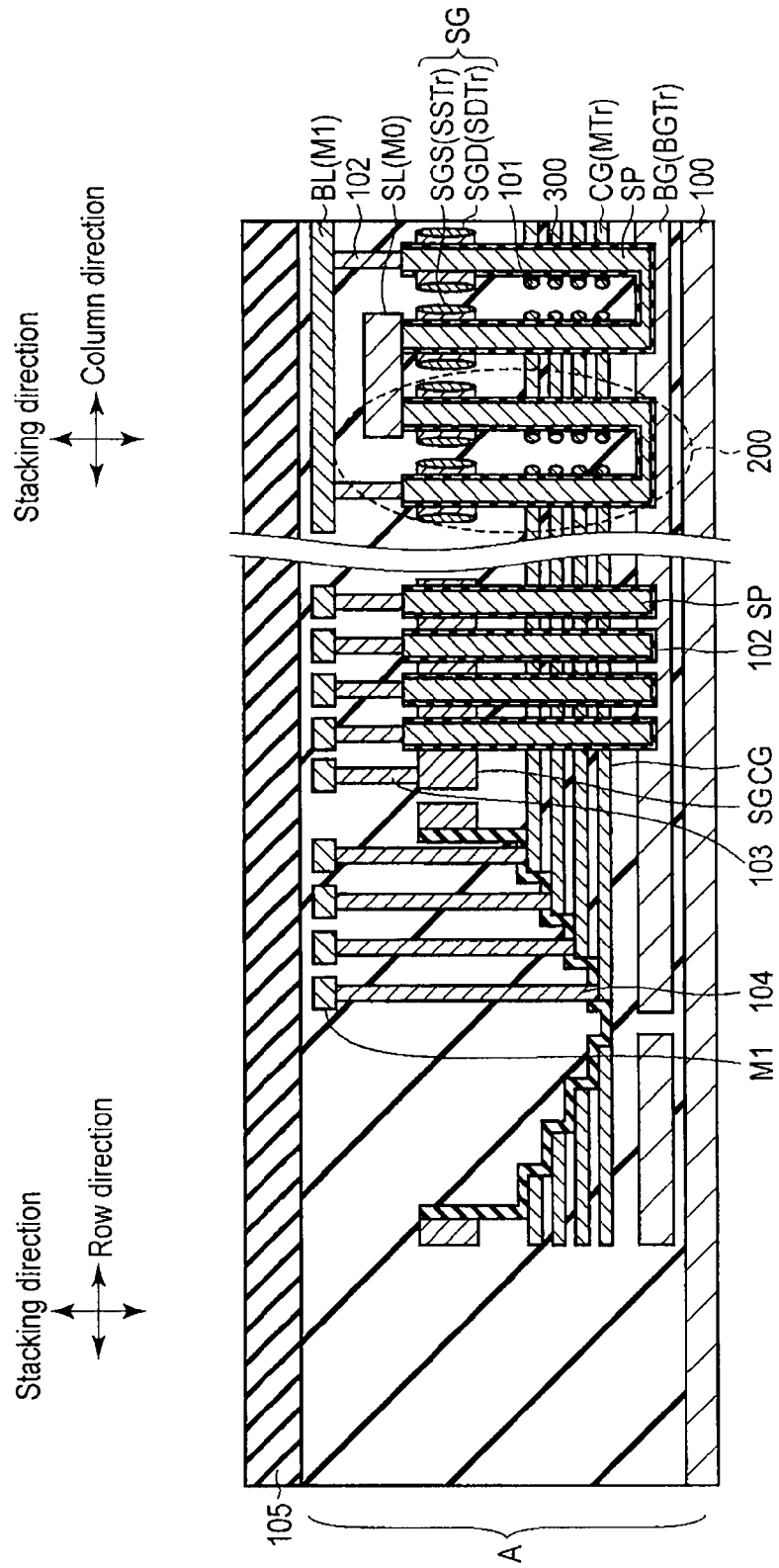
FIG. 4 is a sectional view showing a manufacturing step of the semiconductor memory device according to the first embodiment along the row and column directions.

First, as shown in FIG. 4, a memory cell array portion A is formed on an Si substrate 100 by a well known method. More specifically, a back gate BG, control gates CG, selection gates SG, memory films 300, and U-shaped silicon pillars SP are formed above the Si substrate 100, thereby forming a back gate transistor BGTr, memory cell transistors MTr, source-side selection transistors SSTr, and drain-side selection transistors SDTr.

Then, a source line SL (interconnection layer M0) to be connected on the U-shaped silicon pillars SP on the source side, contact plugs 102 to be connected to the U-shaped silicon pillars SP on the drain side, contact plugs 103 to be connected to the selection gates SG, and contact plugs 104 to be connected to the control gates CG are formed. After that, bit lines BL to be connected to contact plugs 102, and interconnection layers M1 to be connected to contact plugs 103 and 104 are formed. Thus, the memory cell array portion A is formed.

Subsequently, a 500-nm-thick isolation insulating layer 105 consisting of a TEOS film is formed on the entire surface of the memory cell array portion A by, for example, chemical vapor deposition (CVD).

Figure 5:
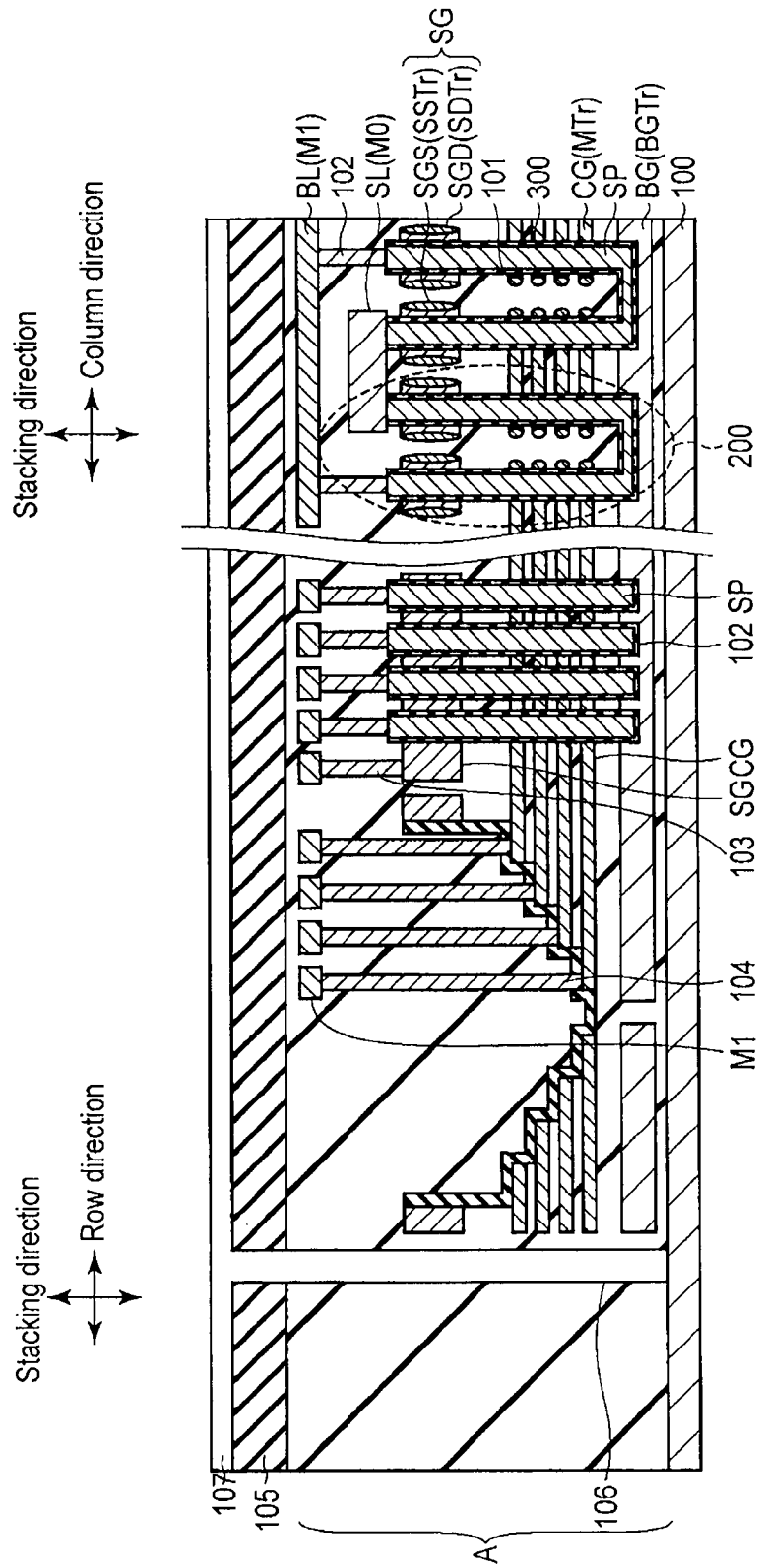
FIG. 5 is a sectional view showing a manufacturing step, which follows FIG. 4, of the semiconductor memory device according to the first embodiment along the row and column directions.

As shown in FIG. 5, a crystal connecting hole 106 is formed through the isolation insulating layer 105 and an interlayer dielectric film in the memory cell array portion A so as to reach the Si substrate 100. This exposes the surface of the Si substrate 100 as the bottom surface of the crystal connecting hole 106.

The sectional shape of the crystal connecting hole 106 in the row and column directions is almost square, and the length of one side is, for example, 25 nm. The sectional shape of the crystal connecting hole 106 is not limited to a square, and can also be, for example, a circle. In effect, a single crystal (to be described later) can be formed even when forming the crystal connecting hole 106 having a circular sectional shape 5 nm in diameter.

When increasing the diameter (the length of the diagonal of a square), the diameter is desirably half or less the depth of the crystal connecting hole 106. For example, when the depth of the crystal connecting hole 106 is 1 μm, the diameter is desirably 500 nm or less. This is so because if the diameter of the crystal connecting hole 106 is much larger than its depth, the ratio of the area with which SiGe, to be formed in the crystal connecting hole 106 later, is in contact with the single-crystal, high-melting-point Si substrate 100 to the amount of SiGe increases. That is, in single-crystal formation (to be described later), a large number of crystallization start points are formed, and this makes it difficult to form single-crystal SiGe in the crystal connecting hole 106.

Then, a polycrystalline or amorphous SiGe layer 107' is formed in the crystal connecting hole 106 and on the isolation insulating layer 105 by CVD or the like. That is, the SiGe layer 107' is buried in the crystal connecting hole 106, and brought into contact with the Si substrate 100 exposed as the bottom surface of the crystal connecting hole 106. The composition ratio of the SiGe layer 107' is $Si_{1-X}Ge_X$ (X≧0.5, desirably, X≧0.75). This makes it possible to readily melt the SiGe layer 107' by annealing at about 1,050° C. in a later step, thereby reliably forming a single crystal when compared with solid-phase growth or the like. In this step, it is also possible to form a single-crystal nucleus by short-time annealing at 1,050° C. This protects the structure of the already formed memory cell array A from being destroyed. Note that a polycrystalline or amorphous Ge single-element layer may also be used instead of the SiGe layer 107'.

Subsequently, a TEOS film (not shown) is formed on the SiGe layer 107' formed on the isolation insulating layer 105, by using, for example, plasma-enhanced chemical vapor deposition (PECVD). In the later annealing step, this TEOS film prevents the melted SiGe layer 107' from flowing and separating, thereby preventing deterioration of the crystallinity.

Figure 6:
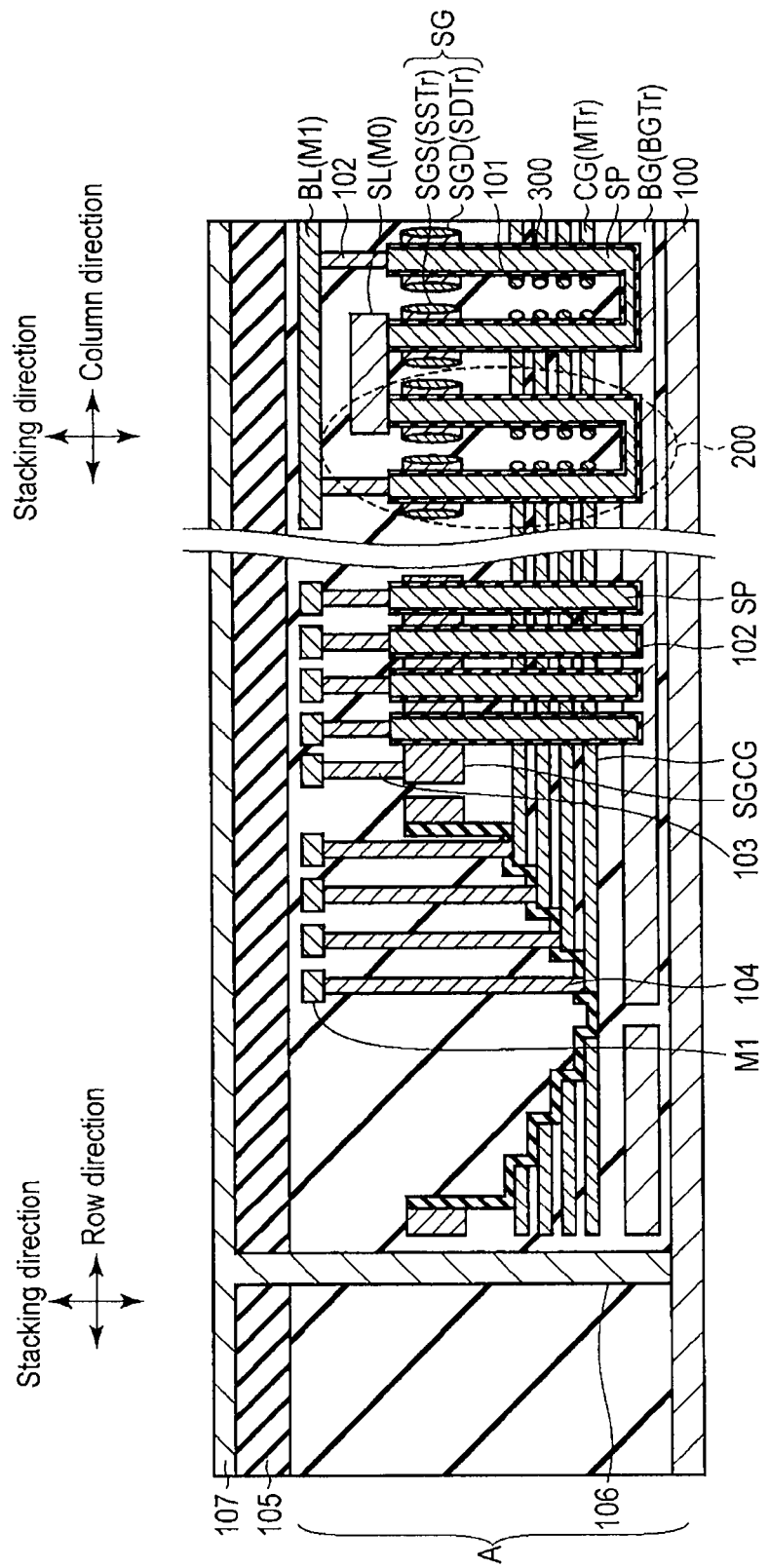
FIG. 6 is a sectional view showing a manufacturing step, which follows FIG. 5, of the semiconductor memory device according to the first embodiment along the row and column directions.

As shown in FIG. 6, rapid thermal annealing (RTA) is performed on the SiGe layer 107'. This RTA is performed in a nitrogen ambient at 950 to 1,100° C., for example, 1,050° C. for 10 seconds. Consequently, the SiGe layer 107' is temporarily melted. After being melted, the SiGe layer 107' recrystallizes when the temperature decreases. In this process, the SiGe layer 107' recrystallizes from a portion close to the surface of the Si substrate 100. Consequently, the SiGe layer 107' recrystallizes to a portion on the isolation insulating layer 105 by succeeding the crystal orientation of the single-crystal Si substrate 100 in contact with the bottom of the SiGe layer 107', thereby forming a single-crystal SiGe layer (first semiconductor layer) 107. In this process, the SiGe layer 107' on the isolation insulating layer 105 evenly recrystallizes from the lower portion, thereby forming the single-crystal SiGe layer 107 having high flatness.

Since the melting point of Ge is 938° C. and that of Si is 1,414° C., the melting point of the SiGe layer 107' is a temperature between them. Therefore, as the composition ratio of Si increases, the melting point of the SiGe layer 107' increases. However, it is presumably possible to form the single-crystal SiGe layer 107 as described above, provided that the melting point of the SiGe layer 107' is at least lower than that of the single-crystal Si substrate 100.

Figure 7:
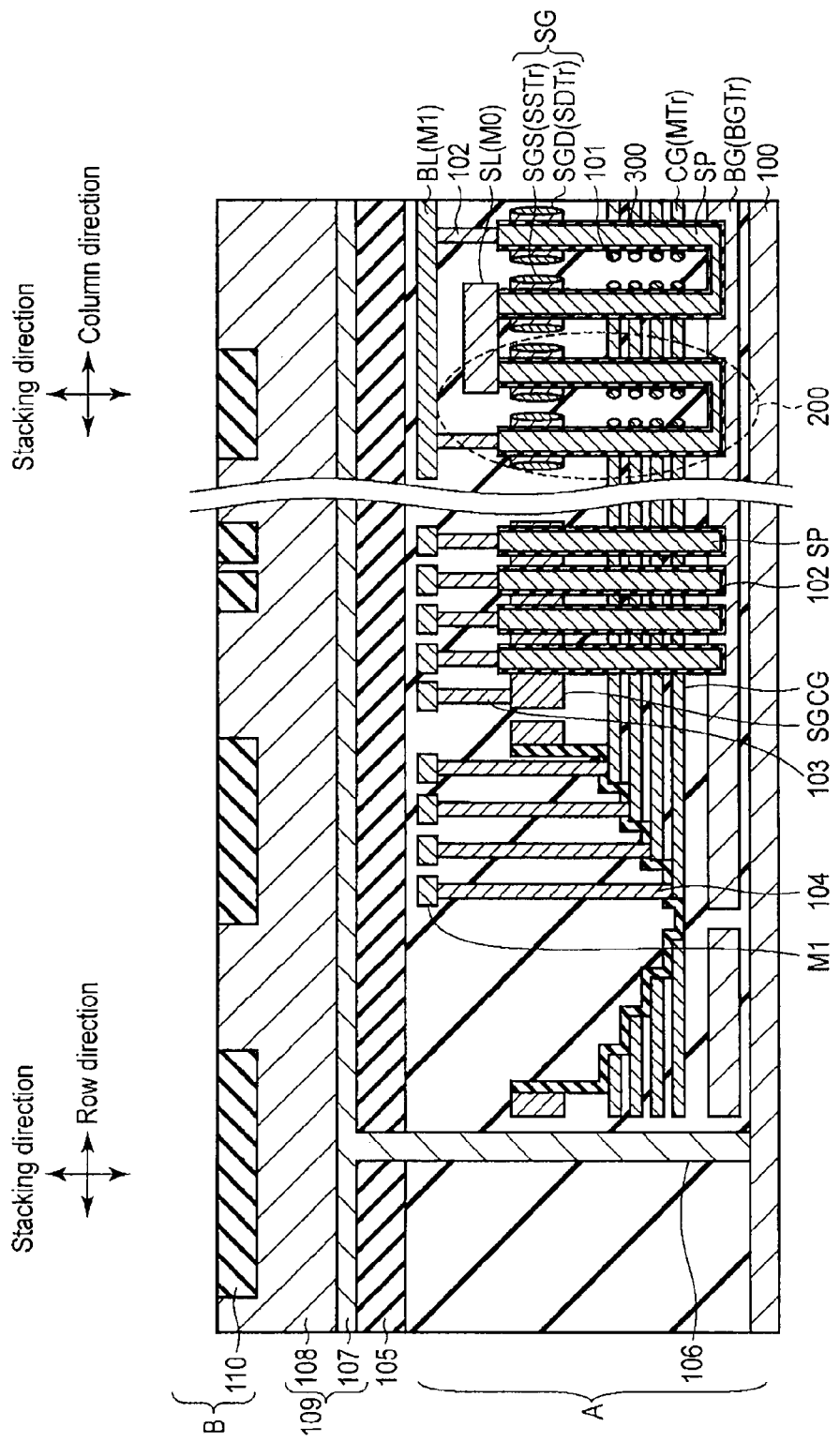
FIG. 7 is a sectional view showing a manufacturing step, which follows FIG. 6, of the semiconductor memory device according to the first embodiment along the row and column directions.

As shown in FIG. 7, after the TEOS film (not shown) on the SiGe layer 107 is removed by processing with diluted hydrofluoric acid, a single-crystal Si layer (second semiconductor layer) 108 is formed on the single-crystal SiGe layer 107 by epitaxial growth by using the single-crystal SiGe layer 107 as a crystal nucleus. Accordingly, a semiconductor layer consisting of a single crystal (a single-crystal semiconductor layer 109) can be formed to have an arbitrary film thickness on the isolation insulating layer 105. In this embodiment, the single-crystal semiconductor layer 109 having a film thickness of 2 μm is formed. Note that an SiGe or SiC layer may be formed by epitaxial growth instead of the single-crystal Si layer 108.

After that, STI 110 for element isolation consisting of, for example, a silicon oxide film is formed in the single-crystal semiconductor layer 109.

Then, as shown in FIG. 1, a circuit portion B (control circuit) is formed on the cell array A by a manufacturing process complying with a known transistor formation process.

More specifically, gate insulating films and gate electrodes forming control circuit transistors Tr are formed, and source/drain diffusion layers (not shown) are formed. After that, an interlayer dielectric film is formed on the entire surface. Subsequently, contact holes reaching interconnection layers M1 (bit lines BL) formed above the memory cell array portion A are formed through the interlayer dielectric film, single-crystal semiconductor layer 109, and isolation insulating layer 105. A sidewall insulating film 111 is formed on the side surfaces of the contact holes by low-pressure chemical vapor deposition (LPCVD) and reactive ion etching (RIE). After that, contact plugs 112 consisting of, for example, tungsten are buried in the contact holes. That is, contact plugs 112 are formed immediately above interconnection layers M1.

At the same time, contact plugs 113 to be connected to the source/drain diffusion layers (not shown) of the control circuit transistors Tr are formed. After that, interconnection layers M2 to be connected to contact plugs 113 are formed to connect interconnection layers M1 and control circuit transistors Tr. Interconnection layers M2 consist of, for example, aluminum (Al) or copper (Cu). In addition, contact plugs 114 to be connected to interconnection layers M2, interconnection layers M3, bonding pads (not shown), and the like are formed, thereby forming the circuit portion B above the memory cell array portion A.

[Effects]

In the above-mentioned first embodiment, the circuit portion B (control circuit) for controlling, for example, voltages to be applied to the memory cell array portion A is formed on it. This makes it possible to form a contact to the bit line BL through a gap between control circuits in an arbitrary position. That is, the bit line BL and circuit portion B can be connected by one plug by forming contact plug 112 immediately above the bit line BL. Accordingly, unlike in the conventional structure in which a circuit portion is formed below a memory cell array, an interconnection or the like need not be returned in the memory cell array end portion and connected to the circuit portion below the memory cell array. Consequently, the chip area can be reduced.

Likewise, the selection gates SG and control gates CG can be connected to the control circuits by forming contact plugs 103 and 104 immediately above these gates. This can also reduce the chip area.

Furthermore, the operating speed can be increased because the interconnections between the memory cell array portion A (for example, the bit lines BL, control gates CG, and selection gates SG) and the circuit portion B practically shorten.

A three-dimensionally stacked memory sometimes requires an annealing step at 900° C. or more in order to form memory elements. Therefore, a method of forming a control circuit below a memory cell array beforehand poses problems such as the diffusion of impurity diffusion layers of transistor elements and the thermal resistance of metal contacts in the control circuit during the annealing step for forming memory elements.

By contrast, in this embodiment, the circuit portion B is formed above the memory cell array portion A, so the circuit portion B is formed after the memory cell array portion A is formed during the manufacturing process. This makes it unnecessary to take account of characteristic deterioration of the circuit portion B in the annealing step for forming memory elements. That is, the degree of freedom of the circuit increases because it is unnecessary to take account of, for example, the diffusion of impurity diffusion layers of transistor elements and the thermal resistance of interconnections in the circuit portion B. For example, it is possible to use Al or Cu interconnections having low thermal resistance but a low electrical resistance, thereby increasing the operating speed. Accordingly, logic circuits and the like requiring a high speed can be formed on the entire surface of the memory cell array by using Al or Cu interconnections.

Also, in a method of epitaxially growing an Si layer directly from a crystal connecting hole, the Si layer on an isolation insulating layer tends to form a large uneven shape like a pyramid shape due to the difference between the growth rates of crystal faces. This makes the method unrealistic because the cost of a later planarizing step increases.

By contrast, in this embodiment, the circuit portion B above the memory cell array portion A is formed on the single-crystal semiconductor layer 109. The single-crystal semiconductor layer 109 is formed by forming the single-crystal SiGe layer 107 on the memory cell array portion A by succeeding the crystal orientation of the single-crystal Si substrate 100 by forming the crystal connecting hole 106, and then forming the single-crystal Si layer 108 by epitaxial growth by using the single-crystal SiGe layer 107 as a nucleus. By thus forming the single-crystal semiconductor layer 109, it is possible to form the low-cost circuit portion B having a high breakdown voltage above the memory cell array portion A.

Note that it is also effective to dope boron as a dopant impurity to the single-crystal SiGe layer 107, in order to improve the element isolation breakdown voltage. More specifically, during the manufacturing process, gaseous $B_2H_6$ can be added when the SiGe layer 107' is deposited, or the impurity can be doped into the single-crystal SiGe layer 107 by ion implantation or vapor-phase doping before the single-crystal Si layer 108 is epitaxially grown.

Furthermore, p-type conductivity can be given to the SiGe layer 107' to be buried in the crystal connecting hole, by adding, for example, gaseous $B_2H_6$ when depositing the layer. Consequently, the potential of the single-crystal semiconductor layer 109 on the memory cell array portion A can be fixed at the same potential as that of the Si substrate 100. This contributes to a stable operation of the control circuit.

Also, this embodiment has been explained by taking an example in which the memory cell array portion A is a collectively processed, three-dimensionally stacked memory, but the present embodiment is not limited to this. For example, this embodiment is also applicable to a three-dimensional memory other than a collectively processed memory, and to a two-dimensionally configured memory. Furthermore, this embodiment is not limited to a NAND flash memory, and also applicable to various memories.

In a three-dimensionally stacked memory (including a collectively processed memory), stacked control gates are processed into a staircase shape in the end portion of a memory cell array, and connected to a control circuit via contact plugs formed on the upper surfaces of this staircase shape. To connect the control gate to a driver circuit (control circuit) in this configuration, however, it is necessary to connect the control gate to an interconnection layer formed on the memory cell array via the contact plug, and connect the interconnection layer to the control circuit below the memory cell array via another deep contact plug in the memory cell array end portion.

Thus, the number of electrodes to be driven per unit area is large in the three-dimensional memory. When peripheral circuits are formed outside or below the memory cell array, therefore, the chip area required to lay out interconnections to these electrodes often increases.

By contrast, in this embodiment, interconnections need not be extracted outside the cell array and can be brought into direct contact with the electrodes, so the chip area can be reduced. This structure has a large effect especially in a memory device in which memory cells are three-dimensionally arranged in the stacking direction.

<Second Embodiment>

A semiconductor memory device according to the second embodiment will be explained below with reference to FIGS. 8 and 9. The second embodiment is an example in which STI is formed to extend through a single-crystal semiconductor layer in a circuit portion immediately above a memory cell array. Note that in the second embodiment, an explanation of the same features as those of the above-mentioned first embodiment will not be repeated, and different features will be explained.

[Structure]

The structure of the semiconductor memory device according to the second embodiment will be explained below with reference to FIG. 8.

Figure 8:
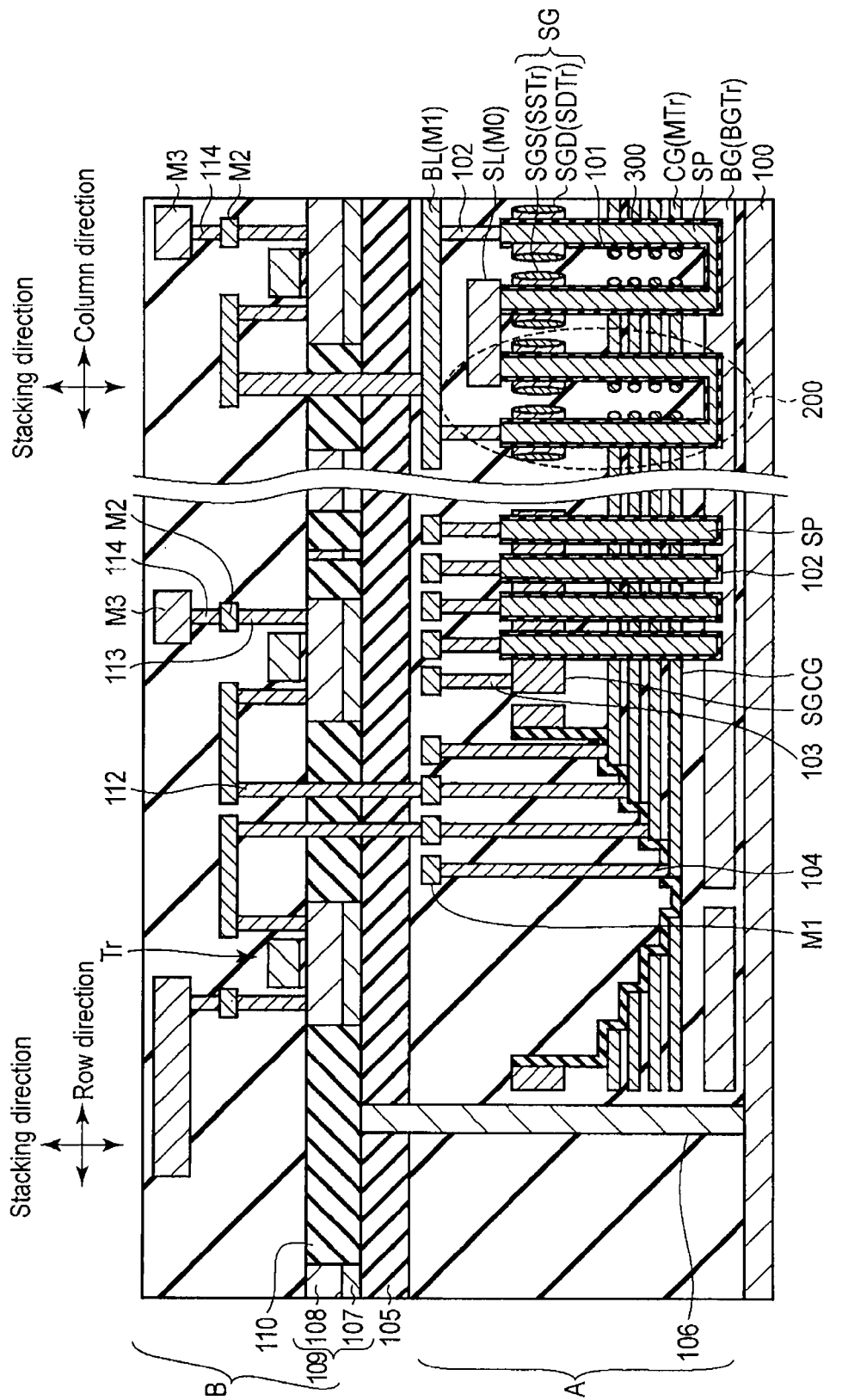
FIG. 8 is a sectional view showing a semiconductor memory device according to the second embodiment along the row and column directions.

FIG. 8 is a sectional view taken along the row and column directions of the semiconductor memory device according to the second embodiment.

As shown in FIG. 8, the second embodiment differs from the above-mentioned first embodiment in that STI 110 formed in a single-crystal semiconductor layer 109 extends through it.

More specifically, the film thickness of the single-crystal semiconductor layer 109 on a memory cell array portion A is decreased to 300 nm. The STI 110 is formed to extend from the first surface (upper surface) of the single-crystal semiconductor layer 109 to its second surface (lower surface) opposing the first surface. That is, the STI 110 is in contact with an isolation insulating layer 105. In other words, semiconductor layers are removed except for element regions.

In the STI 110 extending through the single-crystal semiconductor layer 109, contact plugs 112 for connecting the memory cell array portion A and a circuit portion B positioned immediately above it are formed. Therefore, contact plugs 112 are not in contact with the single-crystal semiconductor layer 109, so no shortcircuit occurs in it. That is, no sidewall insulating film need be formed on the side surfaces of contact holes.

[Manufacturing Method]

A method of manufacturing the semiconductor memory device according to the second embodiment will be explained below with reference to FIG. 9.

Figure 9:
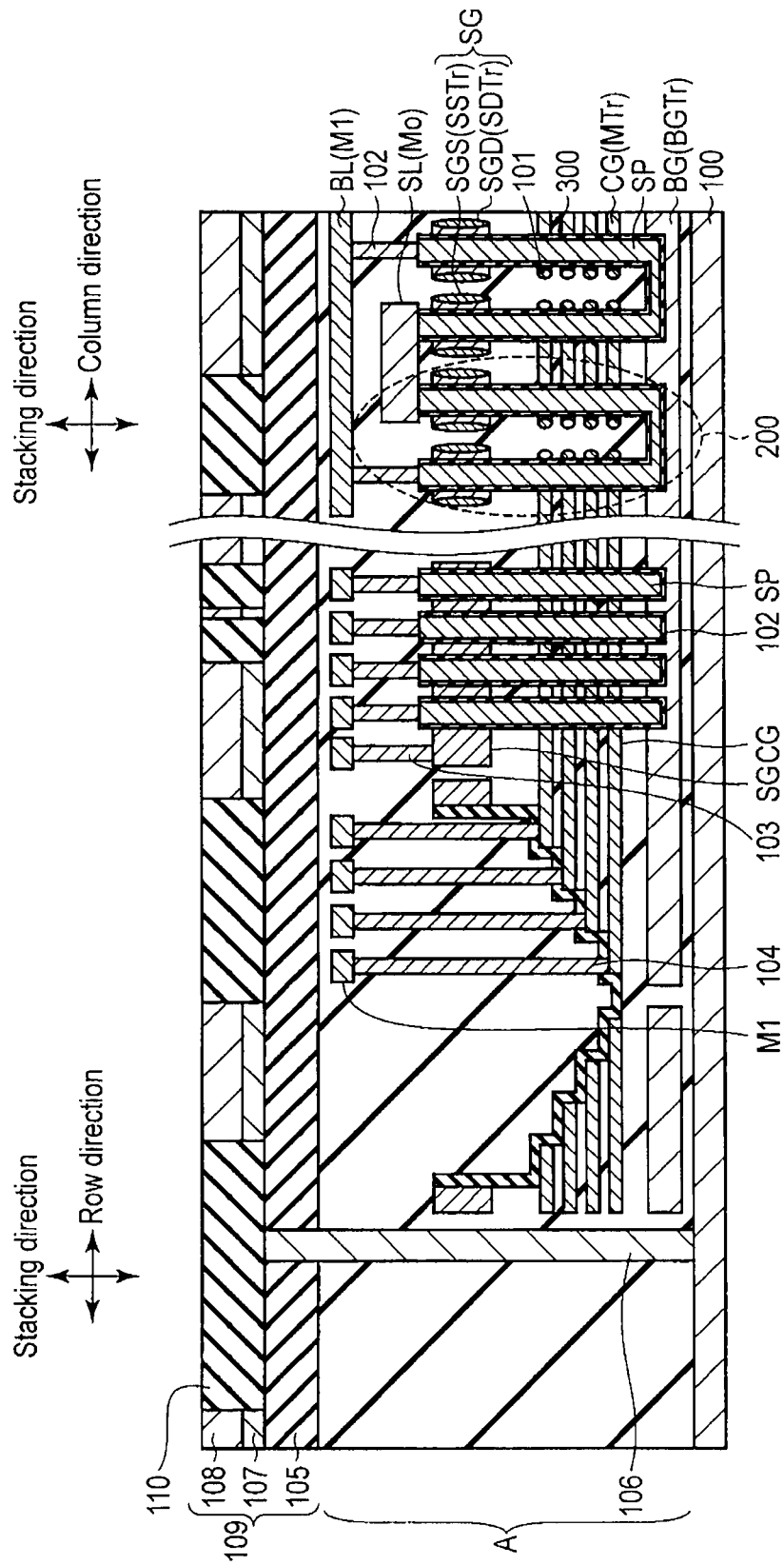
FIG. 9 is a sectional view showing a manufacturing step of the semiconductor memory device according to the second embodiment along the row and column directions.

FIG. 9 is a sectional view of a manufacturing step taken along the row and column directions of the semiconductor memory device according to the second embodiment.

First, the steps shown in FIGS. 4, 5, and 6 in the first embodiment are performed. That is, a memory cell array portion A is formed on an Si substrate 100, and a single-crystal SiGe layer 107 succeeding the crystal orientation of the Si substrate 100 is formed.

Then, as shown in FIG. 9, a TEOS film (not shown) on the SiGe layer 107 is removed by processing with diluted hydrofluoric acid, and a single-crystal Si layer 108 is formed on the single-crystal SiGe layer 107 by epitaxial growth by using the single-crystal SiGe layer 107 as a crystal nucleus. Accordingly, a semiconductor layer consisting of a single crystal (a single-crystal semiconductor layer 109) can be formed to have an arbitrary film thickness on an isolation insulating layer 105. In this embodiment, the film thickness of the single-crystal semiconductor layer 109 is, for example, 300 nm. That is, the single-crystal semiconductor layer 109 thinner than that of the first embodiment is formed.

After that, STI 110 for element isolation consisting of a silicon oxide film or the like is formed in the single-crystal semiconductor layer 109. More specifically, STI trenches are first formed to extend from the upper surface of the single-crystal semiconductor layer 109 to its lower surface opposing the upper surface. In other words, the semiconductor layers are removed except for prospective element regions, thereby exposing the surface of the isolation insulating layer 105 as the bottom surfaces of the STI trenches. In this step, the surface of the isolation insulating layer 105 may also be partially removed. After that, a silicon oxide film or the like is buried in the STI trenches, thereby forming the STI 110.

Subsequently, as shown in FIG. 8, a circuit portion B (control circuit) is formed on the cell array A by a manufacturing process complying with a known transistor formation process.

More specifically, gate insulating films and gate electrodes forming control circuit transistors Tr are formed, and source/drain diffusion layers (not shown) are formed. After that, an interlayer dielectric film is formed on the entire surface. Then, contact holes reaching interconnection layers M1 (bit lines BL) formed above the memory cell array portion A are formed through the interlayer dielectric film, single-crystal semiconductor layer 109, and isolation insulating layer 105. In this step, the contact holes are formed to extend through the STI 110 in the single-crystal semiconductor layer 109. After that, contact plugs 112 consisting of, for example, tungsten are buried in the contact holes, and the same steps as those of the first embodiment are performed.

[Effects]

The above-mentioned second embodiment can achieve the same effects as those of the first embodiment.

In addition, in the second embodiment, the STI 110 is formed to extend through the single-crystal semiconductor layer 109 in the circuit portion B, and contact plugs 112 connecting the circuit portion B and memory cell array portion A are formed in the STI 110. Therefore, contact plugs 112 are not in contact with the single-crystal semiconductor layer 109. Since this obviates the step of forming a sidewall insulating film on the inner walls of the contact holes, the manufacturing process can be simplified.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a semiconductor substrate;
a memory cell array portion formed on the semiconductor substrate, and including memory cells for storing data;
a single-crystal semiconductor layer formed on an insulating layer on the memory cell array portion, and connected to the semiconductor substrate by being formed in a hole extending through the insulating layer and the memory cell array portion; and
a circuit portion formed on the single-crystal semiconductor layer,
wherein a germanium (Ge) concentration in a lower portion of the single-crystal semiconductor layer is higher than that in an upper portion thereof on the memory cell array portion.

2. The device of claim 1, wherein the memory cell array portion includes the memory cells three-dimensionally stacked in a direction perpendicular to the semiconductor substrate.

3. The device of claim 1, wherein
the memory cell array portion comprises memory cell strings arranged in a matrix, and
each memory cell string comprises:
a silicon pillar including a pair of columnar portions extending in a direction perpendicular to the semiconductor substrate and juxtaposed in a column direction, and a connecting portion formed to connect lower ends of the pair of columnar portions;
control gates extending in a row direction to perpendicularly intersect the columnar portions, and stacked in the direction perpendicular to the semiconductor substrate; and
memory cell transistors formed at intersections of each columnar portion and the control gates, and having current paths connected in series in the direction perpendicular to the semiconductor substrate.

4. The device of claim 1, wherein the single-crystal semiconductor layer comprises a single-crystal SiGe layer formed on the insulating layer on the memory cell array portion and connected to the semiconductor substrate by being formed in the hole, and a single-crystal Si layer formed on the single-crystal SiGe layer.

5. The device of claim 4, wherein a Ge concentration in the SiGe layer is not less than 50 atm%.

6. The device of claim 4, wherein the SiGe layer contains a dopant impurity.

7. The device of claim 4, wherein the semiconductor substrate is an Si substrate.

8. The device of claim 1, wherein an interconnection in the memory cell array portion and an interconnection in the circuit portion are connected via a contact plug formed immediately above the interconnection in the memory cell array portion.

9. The device of claim 8, wherein a sidewall insulating film is formed on a side surface of the contact plug.

10. The device of claim 8, further comprising STI formed in the single-crystal semiconductor layer, and extending from a first surface of the single-crystal semiconductor layer to a second surface thereof opposing the first surface,
wherein the contact plug is formed in the STI.

11. The device of claim 8, wherein the interconnection in the circuit portion is made of one of Al and Cu.

12. The device of claim 1, wherein an Si concentration in an upper portion of the single-crystal semiconductor layer is higher than that in a lower portion thereof.

13. The device of claim 1, wherein a C concentration in an upper portion of the single-crystal semiconductor layer is higher than that in a lower portion thereof.

14. The device of claim 1, wherein a diameter of the hole is not more than half a depth thereof.

15. The device of claim 1, wherein the single-crystal semiconductor layer is a gradation layer in which the Ge concentration gradually decreases from the lower portion toward the upper portion.

* * * * *